United States Patent
Nishino et al.

(10) Patent No.: US 7,544,249 B2
(45) Date of Patent: Jun. 9, 2009

(54) LARGE-DIAMETER SIC WAFER AND MANUFACTURING METHOD THEREOF

(75) Inventors: Shigehiro Nishino, Kyoto (JP); Kazutoshi Murata, Tamano (JP)

(73) Assignee: Mitsui Engineering Co. Ltd., Tokyo (JP)

( * ) Notice: Subject to any disclaimer, the term of this patent is extended or adjusted under 35 U.S.C. 154(b) by 199 days.

(21) Appl. No.: 10/520,141

(22) PCT Filed: Jun. 30, 2003

(86) PCT No.: PCT/JP03/08312

§ 371 (c)(1), (2), (4) Date: Sep. 1, 2005

(87) PCT Pub. No.: WO2004/008506

PCT Pub. Date: Jan. 22, 2004

(65) Prior Publication Data

US 2006/0097266 A1   May 11, 2006

(30) Foreign Application Priority Data

Jul. 11, 2002   (JP) ............................... 2002-202953

(51) Int. Cl.
*C30B 29/36* (2006.01)
(52) U.S. Cl. .............................. 117/97; 117/84; 117/88; 117/951; 257/76; 257/77
(58) Field of Classification Search ................... 117/84, 117/88, 97, 951; 257/76, 77
See application file for complete search history.

(56) References Cited

U.S. PATENT DOCUMENTS

| 5,674,320 | A | * | 10/1997 | Kordina et al. | 118/500 |
| 6,053,973 | A | * | 4/2000 | Tanino et al. | 117/4 |
| 6,153,165 | A | * | 11/2000 | Tanino | 423/345 |
| 6,203,772 | B1 | * | 3/2001 | Tanino et al. | 423/345 |
| 6,706,114 | B2 | * | 3/2004 | Mueller | 117/84 |

FOREIGN PATENT DOCUMENTS

| JP | 62119917 A | * | 6/1987 |
| JP | A-10-055975 | | 2/1998 |
| JP | A-11-147794 | | 6/1999 |
| RU | 2 154 698 C2 | | 8/2000 |

OTHER PUBLICATIONS

Patent Abstracts of Japan. English Abstract of JP 62-119917 A (1987).*

* cited by examiner

*Primary Examiner*—Robert M Kunemund
*Assistant Examiner*—Matthew J Song
(74) *Attorney, Agent, or Firm*—Oliff & Berridge, PLC

(57) ABSTRACT

From the viewpoint of manufacturing an SiC semiconductor device economically, a present Si device manufacturing line is utilized to make it possible to handle a small-diameter SiC wafer. Polycrystal SiC is grown from at least one surface side of a small-diameter a-SiC single crystal wafer so as to be in a size of an outer diameter corresponding to a handling device of an existing semiconductor manufacturing line, and thereafter the polycrystal SiC on the surface of the α-SiC single crystal wafer is ground to manufacture an increased-diameter SiC of a double structure in which the polycrystal SiC is grown around an outer circumference of the small-diameter α-SiC single crystal wafer.

2 Claims, 3 Drawing Sheets

LARGE-DIAMETER SIC WAFER AND MANUFACTURING METHOD THEREOF

TECHNICAL FIELD

This invention relates to a large-diameter SiC wafer and a manufacturing method thereof, and particularly relates to an SiC wafer increased in its diameter so that an SiC single crystal wafer used in an SiC semiconductor manufacturing process is made available for practical use, and a manufacturing method thereof.

BACKGROUND ART

There is a liquid phase lifting method in which a seed crystal, which is a base of crystal growth, is immersed in molten silicon while being rotated and is then gradually lifted, on producing an ingot of Si. However, since SiC does not have liquid phase below 3000° C., therefore a sublimation recrystallization method is widely adopted. However, a manufacturing technique of the SiC wafers is not matured, and many of wafers that can be manufactured contain crystal defects in crystal. Since crystal of good quality is not obtained in large-diameter wafers, the size of α-SiC single crystal wafer for SiC semiconductors and GaN emission laser, which is made available for practical use, is limited to about two inches, though it is sold on the market.

On the other hand, as for a device, which can handle an ordinary silicon single crystal wafer, there exist the ones which handle the wafers of 6 inches to 12 inches, and no semiconductor manufacturing line can handle α-SiC single crystal wafers of the size of two inches, which are smaller than the above wafers. This makes it possible to manufacture SiC wafers in the size of two inches available for practical use, but they cannot be provided to the actual industrial world. There is an increased demand especially for putting α-SiC single crystal wafers into practical use, because the α-SiC single crystal wafer has high dielectric strength. Consequently, it is desired to handle this in the semiconductor manufacturing line.

As the above-described manufacturing method of large-diameter silicon single crystal wafers, Japanese Patent Laid-open No. 10-55975 is known. This manufacturing method is for growing polycrystal or single crystal Si around an Si single crystal rod. However, since the silicon single crystal rod is used for a raw material, the device becomes large-scaled, and the raw material applied to this method is only Si, but SiC that is a promising semiconductor material is not disclosed. Further, the obtained double ring layer structure Si is about 1.1 times as large as the raw material diameter and it is difficult to call it achievement of a large diameter.

Paying attention to the above-described problem of the prior art, from the viewpoint of economically manufacturing the SiC semiconductor devices, the present invention has its object to provide a large-diameter SiC wafer, which utilizes the present Si device manufacturing line to make it possible to handle the SiC wafers, and the manufacturing method thereof.

DISCLOSURE OF THE INVENTION

The present invention is to grow a polycrystal SiC with an outer diameter of six inches and an inner diameter of two inches around, for example, an α-SiC single crystal wafer of two inches generally sold on the market. This is obtained by the knowledge that manufacturing of an SiC device by utilizing an existing Si manufacturing line of four inches or more becomes possible due to the above.

Namely, the present invention is characterized by increasing in the diameter as a double structure in which a polycrystal SiC is grown to be in a size, which corresponds to a handling device of the existing semiconductor manufacturing line, around an outer circumference of a small-diameter α-SiC single crystal wafer. In this case, it is desirable to place at least two or more of the aforementioned small-diameter α-SiC single crystal wafers. It is also desirable to make the aforesaid polycrystal SiC to be β-SiC manufactured by a CVD method. Further, it is suitable to constitute the aforesaid polycrystal SiC to have high reflectivity with respect to the laser light for wafer detection.

A manufacturing method of a large-diameter SiC wafer according to the present invention is characterized by including the steps of growing polycrystal SiC from at least one surface side of a small-diameter α-SiC single crystal wafer so as to have an outer diameter size corresponding to a handling device of an existing semiconductor manufacturing line, and thereafter grinding the polycrystal SiC on a surface of the α-SiC single crystal wafer to manufacture an increased-diameter SiC of a double structure in which the polycrystal SiC is grown around an outer circumference of the small-diameter α-SiC single crystal wafer.

According to the above-described constitution, a structure of the wafer in which a polycrystal SiC is formed at a peripheral portion of the α-SiC single crystal wafer is provided. This makes it possible to use the apparatus for the existing Si device to manufacture the SiC device. Since α-SiC is used in the manufacturing line of the Si device, the α-SiC transmits the laser light due to a large band gap with respect to the laser light of the wafer detecting device, and it is determined that the wafer does not exist, even when the wafer actually exists. However, by placing the polycrystal SiC having high reflectivity with respect to the laser light around the α-SiC, wafer detection is made possible in the existing device.

BEST MODE FOR CARRYING OUT THE INVENTION

An embodiment of a large-diameter SiC wafer according to the present invention and a manufacturing method thereof will be explained in detail with reference to the drawings.

A preferred embodiment of an SiC wafer according to the embodiment will be explained with a wafer of six inches taken as an example.

Figure 2:
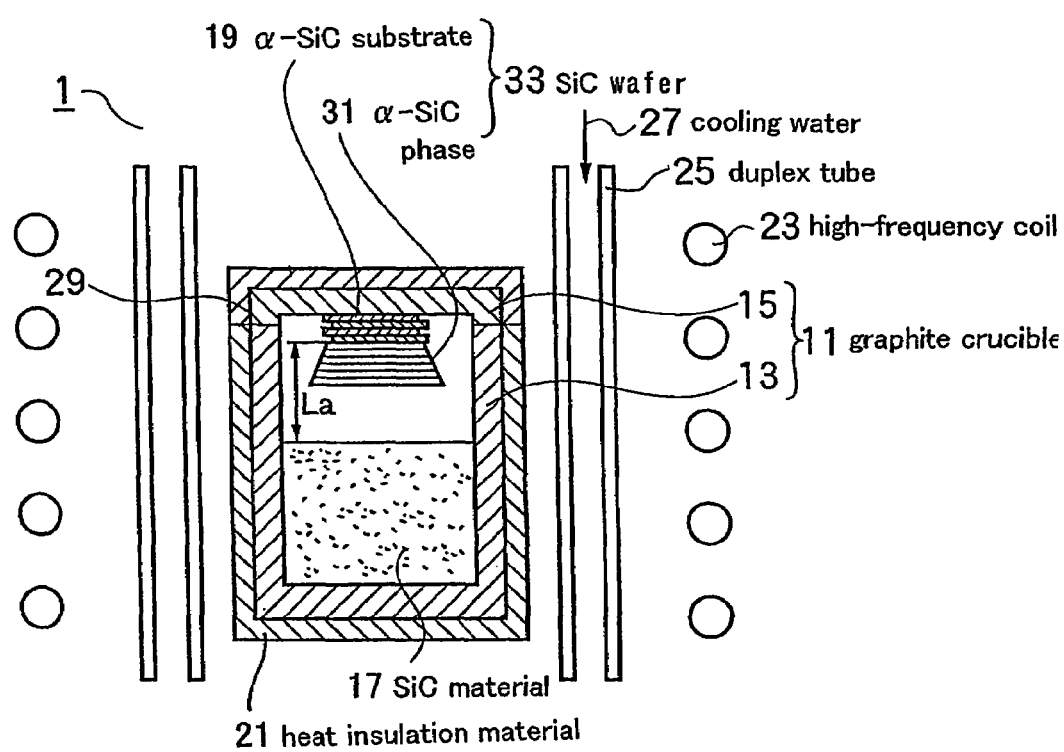
FIG. 2 is a sectional side view of an α-SiC wafer manufacturing apparatus according to the embodiment of the present invention.

First, an α-SiC wafer 10 being a material of the large-diameter SiC wafer may be manufactured as follows, for example. FIG. 2 is a sectional side view of an α-SiC wafer manufacturing apparatus 1. In FIG. 2, a graphite crucible 11 is placed in a center part. The graphite crucible 11 is formed by a crucible body 13 and a lid 15. An SiC raw material 17 is housed in a lower part inside the crucible body 13, and an α-SiC substrate 19 is attached to the lid 15.

The graphite crucible 11 has its outer circumference surrounded by a heat insulation material 21, and is set in a high-frequency furnace not shown. The high-frequency furnace has, for example, a high-frequency coil 23 set on its outer side and has a hollow duplex tube 25 made of quartz constituted of dual tubes made of a quartz material inside it. Cooling water 27 flows between the duplex tubes of the duplex tube 25 made of quartz. The high-frequency furnace is controlled at a fixed temperature by an output produced from a high-frequency oscillator not shown. Consequently, a surface of the graphite crucible 11 is measured with a pyrometer 29 from a clearance of a heat insulating material 21 at its upper portion and lower portion, and the graphite crucible 11 is kept at a fixed temperature by the high-frequency coil 23 being controlled by the output produced by the high-frequency oscillator. When the high-frequency furnace is heated, the SiC material 17 and the α-SiC substrate 19 inside the graphite crucible 11 are heated to about 2,200° C. to 2,400° C. An α-SiC phase 31 is deposited on a surface of the α-SiC substrate 19 and an SiC 33 is formed.

Figure 3:
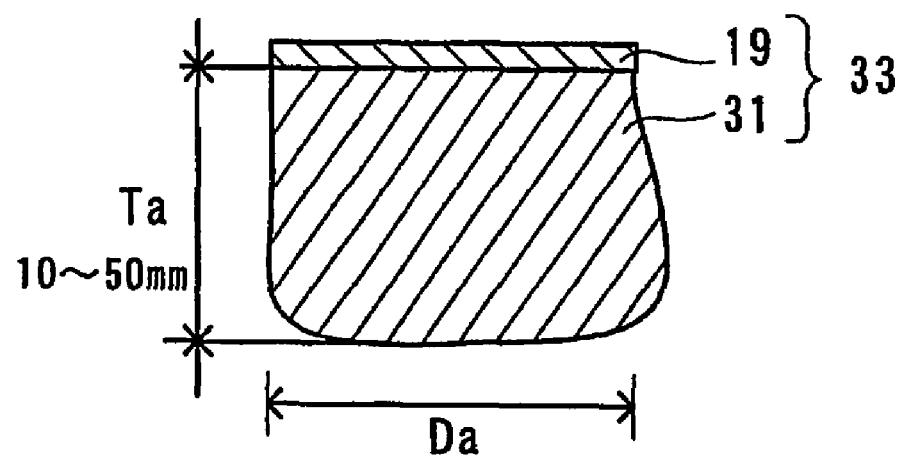
FIG. 3 is a sectional side view of a manufactured SiC wafer according to the embodiment of the present invention.
Figure 4:
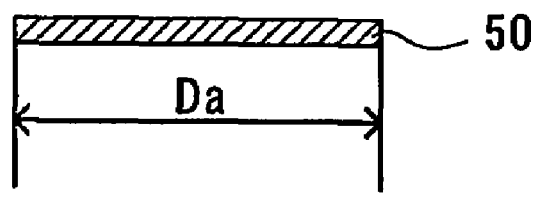
FIG. 4 is a sectional side view of a manufactured α-SiC wafer according to the embodiment of the present invention.

Consequently, as shown in FIG. 3, the α-SiC phase 31 of 6H crystal of thickness of Ta=10~50 mm grows on the α-SiC substrate 19, and by using single crystal for the substrate, single crystal of the same size as that of the substrate diameter can be obtained. Then, the obtained simple crystal bulk (10~50 mm) was at and polished, whereby an α-SiC wafer 50 of 6H is obtained as shown in FIG. 4.

The α-SiC wafer 50 of two inches with the thickness of 0.5 mm manufactured according to the sublimation recrystallization method as described above is used in this embodiment.

Figure 1:
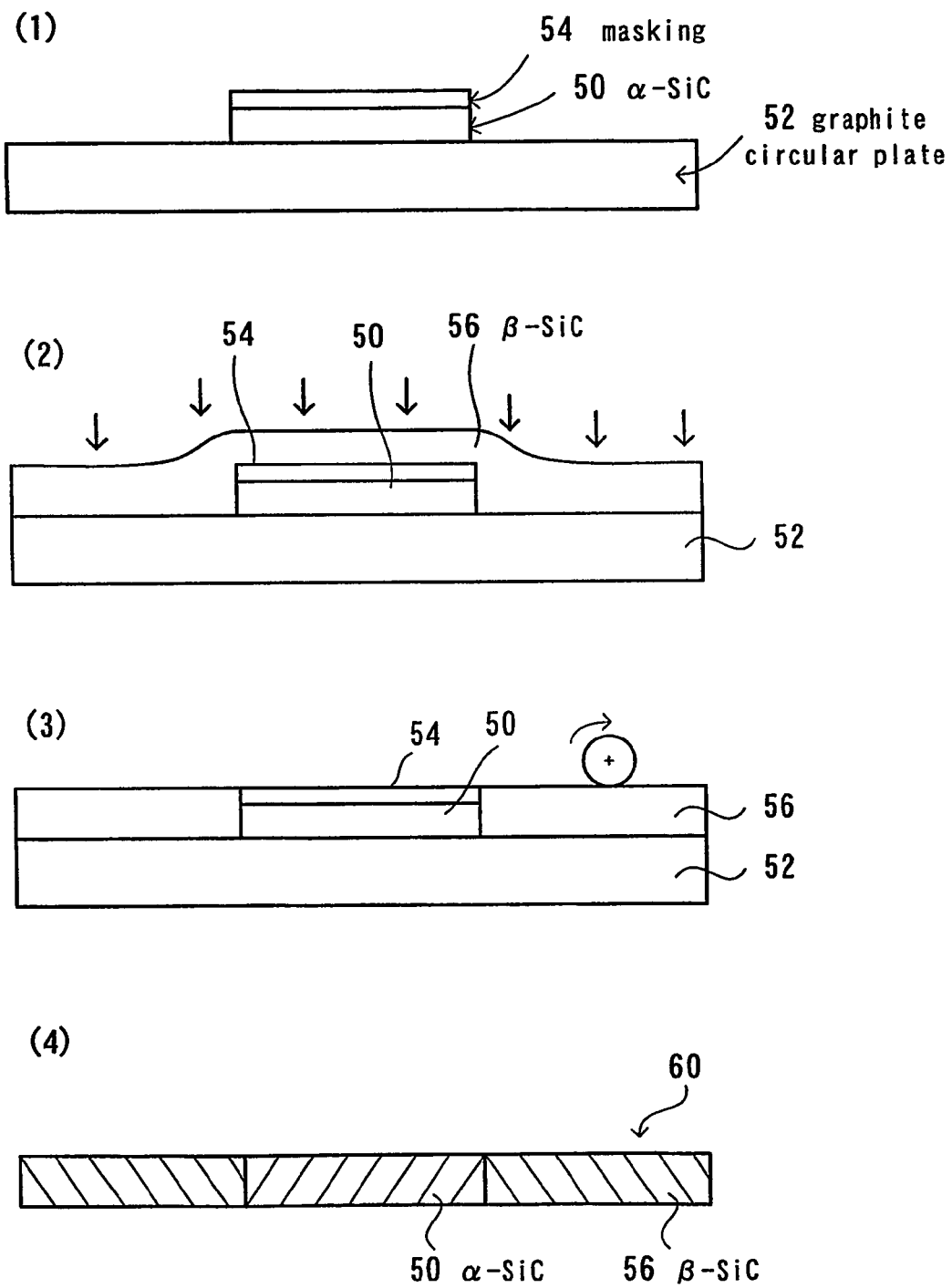
FIG. 1 is a flow chart of a large-diameter SiC wafer according to an embodiment of the present invention.

FIG. 1 shows a manufacturing process of the large-diameter α-SiC wafer. As shown in FIG. 1 (1), the α-SiC wafer 50 is set at a center part of a graphite circular plate 52 with the diameter of 6 inches. Further, a graphite masking 54 is placed on the α-SiC wafer 50.

In this state, a chemical vapor deposition (CVD) method is carried out from the direction of the arrows onto the graphite circular plate 52 and the masking 54 as shown in FIG. 1(2). Namely, $SiH_4$, $SiHCl_3$ and the like are used as a source of Si, and $C_3H_8$ and the like are used as a source of C for the α-SiC single crystal wafer on the graphite plate and they are supplied to a CVD reactor, and inside the CVD reactor, SiC is chemically deposited on the graphite plate and the single crystal wafer. The size of a polycristalline substance formed on the α-SiC single crystal wafer is determined according to the size of graphite plate. According to this, polycrystal a β-SiC 56 with the thickness of 0.8 mm is grown. This process is carried out under the temperature condition of less than 2000° C. to grow the β-SiC 56.

After the chemical vapor deposition, the surplus β-SiC 56 is removed by being ground until a surface of the masking 54 is exposed (FIG. 1(3)). The graphite circular plate 52 and the masking 54 are burnt down, and thus a large-diameter SiC 60 having a double structure of concentric circles can be obtained.

A grinding work and a polishing work are performed for the large-diameter SiC 60, and as shown in FIG. 1(4), a six-inch large-diameter SiC 60 of single plate constituted of a wafer center portion being a single crystal α-SiC wafer 50 two inches in size and a periphery portion being a polycrystal β-SiC 56 is obtained. The single crystal α-SiC wafer 50 at the center portion of the obtained large-diameter SiC 60 is colorless and transparent, or green and transparent, and the polycrystal β-SiC 56 of the periphery portion is yellow or black. Since the obtained large-diameter SiC 60 has the polycrystal β-SiC 56 having high reflectivity with respect to laser light placed at the periphery portion, it is detectable with respect to the laser light of a wafer detection device used in the Si device manufacturing line.

In the above-described embodiment, the polycrystal SiC is formed at the periphery portion, but it does not always have to be a β phase. It does not always have to be produced by the CVD method, and a sublimation method may be used other than this. When SiC is used for the periphery portion in this sublimation method, it is allowed to react at a high temperature, and therefore the crystal system becomes α-SiC of a stable layer.

The handling device of the existing Si semiconductor line can be used as it is for the large-diameter SiC 60 thus constituted. Due to this, a device can be formed in the area of the α-SiC wafer 50 two inches in size, and the α-SiC wafer 50 can be made available for practical use. Accordingly, it becomes possible to use the α-SiC wafer 50 at a practical level, which can be only applied to the semiconductor device in a range of a laboratory facility, and it can be used in the semiconductor industry.

In the above-described embodiment, the α-SiC wafer 50 is placed at the center portion of the large-diameter SiC 60. However, the α-SiC wafer 50 may be formed at a position displaced from the center. Alternatively, it is possible to place a plurality of two-inch α-SiC wafers 50 in a plane of the large-diameter graphite circular plate 52. This is made possible since the technique of depositing the β-SiC 56 on the α-SiC wafer 50 placed on the graphite circular plate 52 is used as shown in FIG. 1.

As explained thus far, the present invention adopts the constitution of the increased diameter as a double structure in which the polycrystal SiC is grown to be in the size, which corresponds to the handling device of the existing semiconductor manufacturing line, in the outer circumference of the small-diameter α-SiC single crystal wafer. Accordingly, from the viewpoint of economically manufacturing the SiC semiconductor device, the effects of making it possible to handle the SiC wafer by utilizing the present Si device manufacturing line can be obtained.

INDUSTRIAL AVAILABILITY

The SiC semiconductor manufacturing method according to the present invention increases the diameter of the α-SiC single crystal wafer two inches in size and makes it possible to utilize it in the handling device of the existing semiconductor manufacturing line.

The invention claimed is:

1. A manufacturing method of a large-diameter SiC wafer comprising the steps of:
   placing a small diameter α-SiC single crystal wafer on a graphite plate;
   forming a film of polycrystal SiC around an outer circumference of said wafer by depositing polycrystal SiC over the graphite plate and over a surface of the α-SiC single crystal wafer;
   grinding the polycrystal SiC on the surface of the α-SiC single crystal wafer to manufacture an increased-diameter SiC of a double structure in which the polycrystal SiC plate portion is planarly formed around an outer circumference of the small-diameter a-SiC single crystal wafer; and
   wherein a top and bottom surface of the small diameter α-SiC single crystal wafer is free of the polycrystal SiC.

2. The manufacture method according to claim 1, further comprising:
   masking the α-SiC single crystal wafer with a mask;
   depositing the polycrystal SiC over the graphite plate on the mask; and
   removing the mask in the grinding, thereby forming the large-diameter SiC wafer.

* * * * *